US011145487B2

(12) United States Patent
Li

(10) Patent No.: US 11,145,487 B2
(45) Date of Patent: Oct. 12, 2021

(54) SCANNING ELECTRON MICROSCOPE WITH COMPOSITE DETECTION SYSTEM AND SPECIMEN DETECTION METHOD

(71) Applicant: FOCUS-EBEAM TECHNOLOGY (BEIJING) CO., LTD., Beijing (CN)

(72) Inventor: Shuai Li, Beijing (CN)

(73) Assignee: FOCUS-EBEAM TECHNOLOGY (BEIJING) CO., LTD., Beijing (CN)

(\*) Notice: Subject to any disclaimer, the term of this patent is extended or adjusted under 35 U.S.C. 154(b) by 0 days.

(21) Appl. No.: 17/054,709

(22) PCT Filed: Sep. 20, 2019

(86) PCT No.: PCT/CN2019/107106
§ 371 (c)(1),
(2) Date: Nov. 11, 2020

(87) PCT Pub. No.: WO2020/220569
PCT Pub. Date: Nov. 5, 2020

(65) Prior Publication Data
US 2021/0066031 A1    Mar. 4, 2021

(30) Foreign Application Priority Data
Jun. 12, 2019 (CN) .......................... 201910507143.4

(51) Int. Cl.
*H01J 37/244* (2006.01)
*H01J 37/28* (2006.01)
*H01J 37/145* (2006.01)

(52) U.S. Cl.
CPC .......... *H01J 37/244* (2013.01); *H01J 37/145* (2013.01); *H01J 37/28* (2013.01);
(Continued)

(58) Field of Classification Search
CPC .... H01J 37/28; H01J 37/244; H01J 2237/151; H01J 2237/152; H01J 2237/24475;
(Continued)

(56) References Cited

U.S. PATENT DOCUMENTS

| 97,978,488 | | 12/1910 | Roesch | |
|---|---|---|---|---|
| 5,578,821 | A * | 11/1996 | Meisberger | ............. H01J 37/28 250/310 |

(Continued)

FOREIGN PATENT DOCUMENTS

| CN | 101499433 A | 8/2009 |
|---|---|---|
| CN | 103376456 A | 10/2013 |

(Continued)

OTHER PUBLICATIONS

International Search Report in the international application No. PCT/CN2019/107106, dated Mar. 12, 2020.
(Continued)

*Primary Examiner* — David A Vanore
(74) *Attorney, Agent, or Firm* — Syncoda LLC; Feng Ma

(57) ABSTRACT

A scanning electron microscope with a composite detection system and a specimen detection method. The scanning electron microscope includes a composite objective lens system including an immersion magnetic lens and an electro lens, configured to focus an initial electron beam to a specimen to form a convergent beam spot; a composite detection system located in the composite objective lens system; and a detection signal amplification and analysis system. A magnetic field of the immersion magnetic lens is immersed in the specimen; the electro lens is configured to decelerate the initial electron beam and focus the initial electron beam onto the specimen, and separate BSEs from a transmission path of an X-ray; the composite detection system is located below an inner pole piece of the immersion
(Continued)

magnetic lens, is located above the control electrode, and includes an annular BSE detector and an annular X-ray detector that have a same axis center.

16 Claims, 5 Drawing Sheets

(52) U.S. Cl.
CPC ............ *H01J 2237/04756* (2013.01); *H01J 2237/1035* (2013.01); *H01J 2237/2445* (2013.01); *H01J 2237/24415* (2013.01); *H01J 2237/24475* (2013.01); *H01J 2237/24495* (2013.01)

(58) Field of Classification Search
CPC .... H01J 37/141; H01J 37/1475; H01J 37/153; H01J 2237/0475; H01J 2237/103; H01J 2237/12; H01J 2237/1516; H01J 2237/2441; H01J 2237/2807; H01J 2237/2813; H01J 37/10; G01N 2223/418; G01N 23/04; G01N 23/2252
USPC .... 250/310, 307, 311, 336.1, 361 R, 370.01, 250/396 ML, 396 R, 397
See application file for complete search history.

(56) References Cited

U.S. PATENT DOCUMENTS

| | | | |
|---|---|---|---|
| 5,591,971 A | 1/1997 | Shahar | |
| 7,705,301 B2 | 4/2010 | Tseng | |
| 8,993,963 B2 | 3/2015 | von Harrach et al. | |
| 9,159,532 B2 | 10/2015 | Hill et al. | |
| 9,299,532 B2 | 3/2016 | Falke | |
| 9,361,275 B2 | 6/2016 | Kooijman et al. | |
| 9,490,100 B2 | 11/2016 | Sytar et al. | |
| 9,601,303 B2 | 3/2017 | Frosien | |
| 10,103,002 B1* | 10/2018 | Gamm | H01J 37/222 |
| 10,134,563 B2 | 11/2018 | Faber et al. | |
| 10,262,832 B2 | 4/2019 | Danilatos | |
| 10,658,152 B1* | 5/2020 | Hendrich | H01J 37/10 |
| 10,777,382 B2* | 9/2020 | Li | H01J 37/1475 |
| 2008/0203301 A1* | 8/2008 | Saito | H01J 37/10 250/311 |
| 2010/0270468 A1* | 10/2010 | Liu | H01J 37/28 250/310 |
| 2013/0056634 A1* | 3/2013 | Sluijterman | H01J 37/28 250/307 |
| 2013/0277555 A1 | 10/2013 | Kooijman et al. | |
| 2014/0070098 A1 | 3/2014 | Sytar et al. | |
| 2014/0197310 A1* | 7/2014 | Hill | G01N 23/2254 250/307 |
| 2016/0133436 A1 | 5/2016 | Faber et al. | |
| 2016/0314931 A1* | 10/2016 | Fichter | H01J 37/28 |
| 2017/0047192 A1* | 2/2017 | Frosien | H01J 37/145 |
| 2017/0236683 A1* | 8/2017 | Hegele | H01J 37/141 250/307 |
| 2017/0336335 A1* | 11/2017 | Hendrich | H01J 37/263 |
| 2017/0338078 A1* | 11/2017 | Jiruse | H01J 37/1475 |
| 2018/0218877 A1* | 8/2018 | Berger | G01N 23/225 |
| 2018/0226221 A1* | 8/2018 | Danilatos | H01J 37/1472 |
| 2018/0286632 A1* | 10/2018 | Biberger | G01N 1/06 |
| 2018/0358199 A1 | 12/2018 | Kumamoto et al. | |
| 2019/0318905 A1* | 10/2019 | Preikszas | H01J 37/1471 |
| 2019/0355551 A1* | 11/2019 | Pavia | H01J 37/243 |

FOREIGN PATENT DOCUMENTS

| | | |
|---|---|---|
| CN | 103681186 A | 3/2014 |
| CN | 103946889 A | 7/2014 |
| CN | 104089966 A | 10/2014 |
| CN | 105588644 A | 5/2016 |
| CN | 207425790 U | 5/2018 |
| CN | 108231511 A | 6/2018 |
| CN | 108352284 A | 7/2018 |
| CN | 208256614 U | 12/2018 |
| CN | 109300759 A | 2/2019 |
| CN | 109709121 A | 5/2019 |
| EP | 2706554 A1 | 3/2014 |
| JP | 2017037843 A | 2/2017 |

OTHER PUBLICATIONS

Written Opinion of the International Search Authority in the international application No. PCT/CN2019/107106, dated Mar. 12, 2020.
First Office Action of the Chinese application No. 201910507143.4, dated Mar. 19, 2020.
Notice of Allowance of the Chinese application No. 201910507143. 4, dated Jul. 31, 2020.
J. Frosien, E. Plies, and K. Anger, "Compound magnetic and electrostatic lenses for low-voltage applications", Journal of Vacuum Science & Technology B, Dec. 31, 1989.
Guo Xiaoli et al. "Generation and Calculation of Intense Electron Beam with Micro-Spot Size" Chinese Journal of Vacuum Science and Technology, Dec. 31, 2006.
Decsion to Grant a Patent (Notice of Allowance) in Chinese application No. 201910507143.4, dated Jul. 31, 2020.

* cited by examiner

SCANNING ELECTRON MICROSCOPE WITH COMPOSITE DETECTION SYSTEM AND SPECIMEN DETECTION METHOD

CROSS-REFERENCE TO RELATED APPLICATIONS

The present application is a national stage of International Application No. PCT/CN2019/107106 filed on Sep. 20, 2019, which claims priority to Chinese Patent Application No. 201910507143.4 filed on Jun. 12, 2019. The disclosures of these applications are hereby incorporated by reference in their entireties.

TECHNICAL FIELD

The disclosure relates to the field of scanning electron microscope technologies, and in particular, to a scanning electron microscope with a composite detection system and a specimen detection method.

BACKGROUND

A scanning electron microscope is a commonly used microscopic analysis instrument. Generally, an electron beam is focused on a specimen through an objective lens of a scanning electron microscope to produce a tiny beam spot, and the electron beam excites and produces Secondary Electrons (SE), Back-scatter Electrons (BSE), an X-ray, and the like, so that a detector may be used to observe a morphology of a specimen surface and analyze material composition.

Currently, there are many methods for implementing energy spectrum detection. For example, a side-type X-ray detector may be used. However, a solid angle of an X-ray signal received by the X-ray detector is small, and the X-ray detector has a low collection efficiency and cannot obtain a high-speed X-ray image. Although a solid angle of a detected X-ray can be increased by arranging multiple X-ray detectors, this implementation method is complex, and requires a large occupation space.

In addition, in a process of using a conventional scanning electron microscope, a high-resolution BSE image of a specimen and an X-ray image of the specimen are captured in different conditions, and thus a relatively long time needs to be consumed. In addition, when information about the two images needs to be compared, further processing and analysis need to be performed on the two images because image sizes and center positions of the two images are slightly different due to different image capturing conditions. This requires a longer time, thereby reducing detection efficiency.

SUMMARY

In view of this, embodiments of the disclosure are intended to provide a scanning electron microscope with a composite detection system and a specimen detection method, to detect BSEs and an X ray within a relatively large solid angle range at the same time, and thus improve detection efficiency.

To achieve the above purpose, technical solutions of embodiments of the disclosure are achieved as follows.

The embodiments of the disclosure provide a scanning electron microscope with a composite detection system, including a composite objective lens system, a composite detection system, and a detection signal amplification and analysis system.

The composite objective lens system includes an immersion magnetic lens and an electro lens, and configured to focus an initial electron beam to a specimen to form a convergent beam spot.

The composite detection system is located in the composite objective lens system.

The magnetic field of the immersion magnetic lens is immersed in the specimen, and an opening direction of a pole piece is directed towards the specimen.

The electro lens includes the composite detection system, the specimen, a control electrode, and a voltage source, and is configured to decelerate the initial electron beam and focus the initial electron beam onto the specimen, and separate Back-scatter Electrons (BSE) from a transmission path of an X-ray.

The composite detection system is located below an inner pole piece of the immersion magnetic lens, is located above the control electrode, and includes an annular BSE detector and an annular X-ray detector that have a same axis center, where the axis center is a center of a principal optic axis of an electron beam produced by an electron source.

The BSE detector is located in an inner ring, and the X-ray detector is located in an outer ring.

Optionally, the annular BSE detector and the annular X-ray detector are located on a same plane or on different planes.

Optionally, a distance between the control electrode at a lowermost end of the composite objective lens system and the specimen is less than or equal to 5 mm.

Optionally, a distance between the control electrode located at a lowermost end of the composite objective lens system and the specimen is greater than or equal to 0.5 mm and is less than or equal to 2 mm.

Optionally, a diameter of a center hole of the annular BSE detector is less than or equal to 3 mm.

Optionally, a diameter of a center hole of the annular BSE detector is greater than or equal to 0.5 mm and is less than or equal to 2 mm.

Optionally, a diameter of a center hole of the annular X-ray detector is greater than 3 mm and is less than 10 mm.

Optionally, a diameter of a center hole of the control electrode is greater than that of a center hole of the annular BSE detector and is less than or equal to an external diameter of the annular X-ray detector.

Optionally, the annular BSE detector is a semiconductor detector, and the detector used for the annular X-ray detector is a semiconductor silicon drift detector or a semiconductor lithium drift detector.

Optionally, a layer of conductive metal film is disposed on a lower surface of the annular BSE detector; and a hermetic window is disposed on a lower surface of the annular X-ray detector.

Optionally, both a thickness of the annular BSE detector and a thickness of the annular X-ray detector are less than 10 mm.

Optionally, the detection signal amplification and analysis system is connected to the annular BSE detector and/or the annular X-ray detector, and is configured to process a first signal generated by the annular BSE detector based on received back-scatter electrons and/or a second signal generated by the annular X-ray detector based on a received X-ray.

Optionally, the detection signal amplification and analysis system is further configured to synthesize the processed first signal and the processed second signal to form a composite image.

The embodiments of the disclosure further provide a specimen detection method, applied to a scanning electron microscope provided with a composite detection system, where the method includes the following operations:

An accelerated initial electron beam is enabled to enter a composite objective lens system along a principal optic axis, pass through a center hole of a composite detection system, and converge on a specimen to produce signal electrons, wherein the composite detection system includes an annular back-scatter electron BSE detector and an annular X-ray detector that have a same axis center, where the axis center is a center of the principal optic axis of the electron beam.

The annular back-scatter electron BSE detector and the annular X-ray detector respectively receive back-scatter electrons BSEs and an X-ray from the signal electrons produced at a same location of the specimen.

Optionally, the operation of respectively receiving, by the annular Back-scatter Electron (BSE) detector and the annular X-ray detector, Back-scatter Electrons (BSE) and an X-ray from the signal electrons produced at a same location of the specimen includes: causing the BSEs in the signal electrons to perform accelerated movement upwards under action of an electric field of an electro lens of the composite objective lens system and under influence of an immersion magnetic lens, and receiving the BSEs by the annular BSE detector in an outer ring; and causing the X-ray produced at the same location of the specimen to move upwards, and to be received by the annular X-ray detector.

Optionally, the method further includes: processing, by a detection signal amplification and analysis system, the BSEs received by the annular BSE detector and the X-ray received by the annular X-ray detector, and outputting the processed BSEs and the processed X-ray.

The scanning electron microscope with a composite detection system provided in the embodiments of the disclosure includes a composite objective lens system including an immersion magnetic lens and an electro lens, configured to focus an initial electron beam to a specimen to form a convergent beam spot; a composite detection system located in the composite objective lens system; and a detection signal amplification and analysis system. A magnetic field of the immersion magnetic lens is immersed in the specimen, and an opening direction of a pole piece is directed towards the specimen; the electro lens includes the composite detection system, the specimen, a control electrode, and a voltage source, and is configured to decelerate the initial electron beam and focus the initial electron beam onto the specimen, and separate Back-scatter Electrons (BSE) from a transmission path of an X-ray; the composite detection system is located below an inner pole piece of the immersion magnetic lens, is located above the control electrode, and includes an annular Back-scatter Electron (BSE) detector and an annular X-ray detector that have a same axis center, where the axis center is a center of a principal optic axis of an electron beam produced by an electron source; and the BSE detector is located in an inner ring, and the X-ray detector is located in an outer ring. The annular composite detection system in the embodiments of the disclosure is located in the composite objective lens system, and can ensure high resolution of an image while ensuring receiving BSEs and an X-ray at the same time, at a same location of a specimen and at a same emission angle, so as to implement fast imaging and improve detection efficiency of the specimen.

DETAILED DESCRIPTION OF EMBODIMENTS

Figure 1:
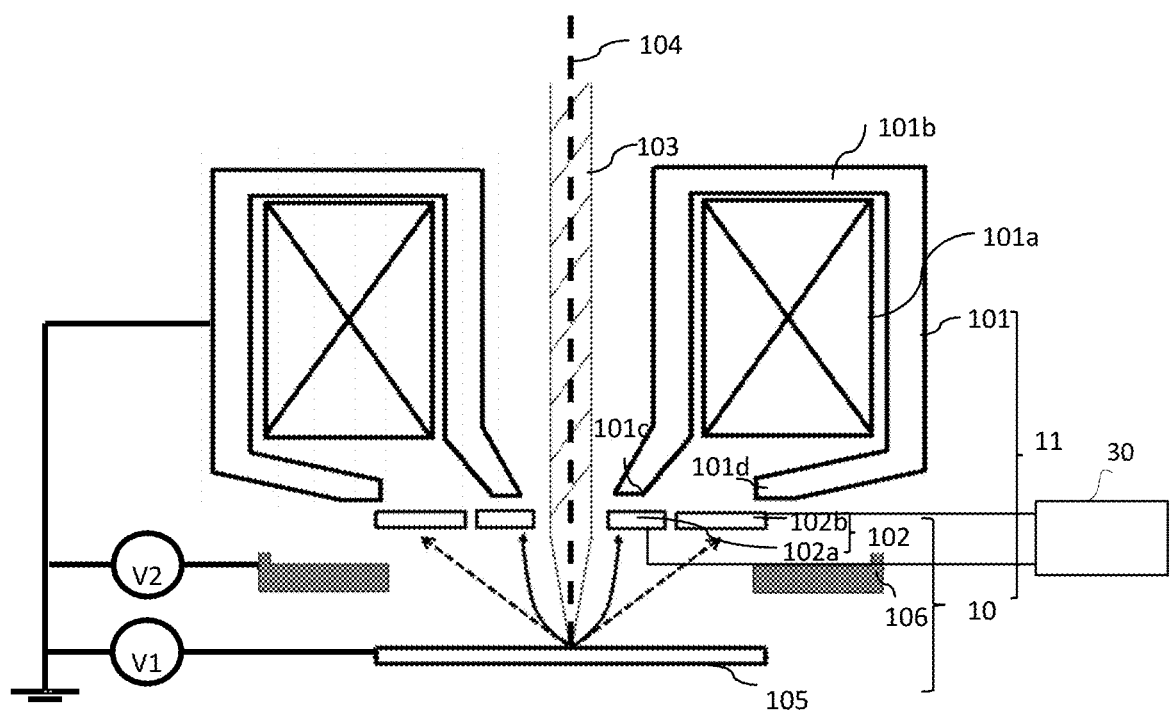
FIG. 1 is a schematic structural diagram of a scanning electron microscope with a composite detection system according to an embodiment of the disclosure.

The following describes the disclosure with reference to accompany drawings and embodiments. It should be understood that the specific embodiments described herein are used only to explain the disclosure, but are not intended to limit the disclosure.

In the related art, the X-ray detector used in the electron microscope is a conventional side-type tubular X-ray detector. When an electron beam of an electron microscope bombards a specimen, an X-ray is produced. Because the produced X-ray is emitted from a specimen surface at a 4 $\pi$ solid angle, the side-type X-ray detector can only receive an X-ray on a hemispherical surface within a small solid angle. In this case, signal efficiency is relatively low; noise is relatively large; and averaging needs to be performed on X-ray image signals for several times to reduce the noise. As a result, a high-speed X-ray image cannot be obtained.

To improve X-ray detection efficiency or obtain more abundant X-ray image information, usually, several X-ray detectors or multiple X-ray detector channels are used to increase a solid angle of the detecting X-ray. For example, in a space between an objective lens of an electron beam microscope and a specimen, four detectors are arranged in four quadrants. Alternatively, an X-ray detector with two channels may detect X-rays on upper and lower hemispheres within a specific solid angle range, and may obtain more X-ray information, so as to improve the detection efficiency and increase the detection speed. Although this solution can improve X-ray detection efficiency, the implementation thereof is relatively complex, and needs a large occupation space.

In the related art, in an embodiment in which an annular-sheet-type X-ray detector is used, X-rays in larger solid angles are detected in addition to X-rays passing through a central hole; a collection solid angle of the X-ray detector is up to 60 degrees; reception efficiency of X-rays is high; and as a result, an imaging speed of an X-ray image is greatly improved. However, there are the following problems. First, the X-ray detector needs to be inserted between an objective lens and a specimen, and in this case, the X-ray detector blocks detection of other signal electrons such as BSEs and SEs, which prevents simultaneous imaging. In addition, the X-ray detector occupies the space, and increases a working distance between the objective lens and the specimen. Usually, a longer working distance of a scanning electron microscope leads to lower resolution. Usually, when the scanning electron microscope is working at a high resolution, the working distance is less than 2 mm, and the sheet-type X-ray detector occupies more than 5 mm due to its telescopic structure and its thickness, so that the working distance is increased. In this case, the resolution of the scanning electron microscope is relatively low, that is, a beam spot of an electron beam focused on the specimen is relatively large. In this case, an area in which X-ray information is produced is larger than an area in which X-ray information is produced when the resolution is high, and material information reflected by the produced X-ray image is not as accurate as that when the working distance is small.

In the related art, to enable BSE collection as well as implement high-efficiency, an optional embodiment is further provided. To be specific, a composite electromagnetic objective lens of an electron microscope is provided with an annular back-scatter electron (BSE) detector and a secondary electron (SE) detector located above the objective lens. However, there is no X-ray detector in this system, signal electrons and X-rays produced on the specimen cannot be observed simultaneously. That is, spectrum collection and collection of back-scatter rays cannot be performed simultaneously. If a conventional manner is used to observe an X-ray energy spectrum produced by an electron beam on the specimen, an additional EDS detector needs to be used. A conventional tubular EDS detector inserted from a side of an objective lens has a small solid angle for receiving signals and low reception efficiency, and therefore cannot implement high-speed X-ray signal detection. However, an annular EDS detector has a large solid angle for receiving signals and has high efficiency, but it needs to be inserted into the space between the objective lens and the specimen, which not only increases a working distance between the objective lens and the specimen and affects resolution of the objective lens, but also occupies a track of signal electrons to be detected by the BSE detector. As a result, the BSE detector cannot receive electrons at this time.

In view of the foregoing problem, embodiments of the disclosure provide a scanning electron microscope with a composite detection system. As illustrated in FIG. 1, the scanning electron microscope includes a composite objective lens system 11 composed of an immersion magnetic lens 101 and an electro lens 10. The composite objective lens system 11 is configured to focus an initial electron beam (that is, an electron beam 103) to a specimen to form a convergent beam spot. The scanning electron microscope further includes a composite detection system 102 located in the composite objective lens system 11, and a detection signal amplification and analysis system 30.

The composite detection system 102 is located below an inner pole piece 101c of the immersion magnetic lens, is located above a control electrode 106, and includes an annular Back-scatter Electron (BSE) detector 102a and an annular X-ray detector 102b that have a same axis center, where the axis center is a center of a principal optic axis 104 of an electron beam 103 produced by an electron source (not shown in FIG. 1).

The BSE detector 102a is located in an inner ring, and the X-ray detector 102b is located in an outer ring.

In an embodiment of the disclosure, after entering the composite objective lens system 11 along the principal optic axis 104, the electron beam 103 passes through a center hole of the composite detection system 102, and is focused on a specimen 105 under action of an electromagnetic field to form a focus point.

In an embodiment, the annular BSE detector and the annular X-ray detector are located on a same plane, as shown in FIG. 1.

In another embodiment, the annular BSE detector and the annular X-ray detector are located on different planes.

In an embodiment of the disclosure, as shown in FIG. 1, the composite objective lens system 11 includes an immersion magnetic lens 101, where the immersion magnetic lens 101 is an immersion magnetic lens excited by a current coil. An exciting coil 101a, of the immersion magnetic lens 101, formed by winding metal wires is externally provided with a housing 101b made of a ferromagnetic material. An opening of the immersion magnetic lens 101 is a pole piece of the magnetic lens. The pole piece of the magnetic lens includes an inner pole piece 101c close to a central optical axis and an outer pole piece 101d far away from the central optical axis. A magnetic field of the magnetic lens is immersed in the to-be-observed specimen 105. An opening of a pole piece of an objective lens of a conventional non-immersion magnetic lens faces towards a principal optic axis of an electron beam. A converging magnetic field of the magnetic lens is relatively far away from the specimen. Therefore, a focal length of the objective lens is relatively large and an imaging aberration is relatively large, which is not conducive to resolution observation. However, the immersion magnetic lens has a smaller focal length and a relatively smaller aberration, and it is suitable to converge the electron beam 103 to a smaller microbeam spot and it is suitable for high resolution observation. In addition, there are the composite detection system 102, the control electrode 106, and the specimen 105 below the magnetic lens, and the composite detection system 102, the control electrode 106, and the specimen 105 have different voltages and form a retarding-type electrostatic lens. The electrostatic lens (that is, the electro lens 10) is a retarding-type cathode lens. There is a specific overlap between an electric field of the retarding-type cathode lens and a magnetic field of the immersion magnetic lens, and composite focusing of the retarding-type cathode lens and the immersion magnetic lens may further reduce an aberration of the objective lens system, so as to obtain an aberration less than that of a pure immersion magnetic lens to obtain a smaller focused beam spot, thereby achieving higher resolution.

The electron beam 103 passes through the center hole of the composite detection system 102 and a center hole of the control electrode 106, and is converged on the specimen 105. Both the composite detection system 102 and the immersion magnetic lens 101 are in a low ground potential, and voltages V1 and V2 are applied on the specimen 105 and the control electrode 106 respectively. A voltage value of the specimen meets $V1 \le -3$ kV; the voltage V2 of the control electrode meets $V1 \le V2 \le 0$; and after the voltage value of the specimen is determined, of the voltage V2 may be adjusted to control a track of returned signal electrons.

The electro lens 10 includes the annular composite detection system 102, the specimen 105, the annular control electrode 106, and a voltage source (there is a related structure, and it is not shown in the figure), and is configured to decelerate the initial electron beam 103 and focus the initial electron beam 103 onto the specimen 105, and separate BSEs from a transmission path of an X-ray. A center hole of the annular composite detection system is $\Phi 1$, and an external diameter of a detection area of the composite detection system 102 is $\Phi 3$ (a detection external-diameter of the X-ray detector), where $\Phi 1 \le 3$ mm. In an optional embodiment, a range of $\Phi 1$ is 0.5 mm to 2 mm. An inner bore diameter of the control electrode 106 is $\Phi 2$, and meets $\Phi 3 \ge \Phi 2 > \Phi 1$. A distance from the control electrode 106 of the electro lens 10 to the specimen 105 is a Working Distance (WD) of the scanning electron microscope of the objective lens system. To obtain a tiny focused beam spot, implement high resolution, and obtain relatively high efficiency of the BSE detector and the X-ray detector, a distance less than or equal to 5 mm is usually selected as the WD. In an optional embodiment, a range of the WD is 0.5 mm to 2 mm.

The composite detection system 102 includes an annular Back-scatter Electron (BSE) detector 102a and an annular X-ray detector 102b, where the annular BSE detector 102a is located in an inner ring of the annular X-ray detector 102b.

In another embodiment, the composite detection system 102 is of an annular sheet structure; its thickness is several millimeters; and a thicknesses of each of the annular BSE detector and the annular X-ray detector is less than 10 mm, so as to avoid occupying overmuch space between the immersion magnetic lens 101 and the specimen 105.

In an embodiment, the annular back-scatter electron detector 102a is a semiconductor detector, for example, a PN junction semiconductor detector, and the annular X-ray detector 102b is a semiconductor silicon drift detector or a semiconductor lithium drift detector, which can effectively control a thickness of the composite detector.

Figure 2:
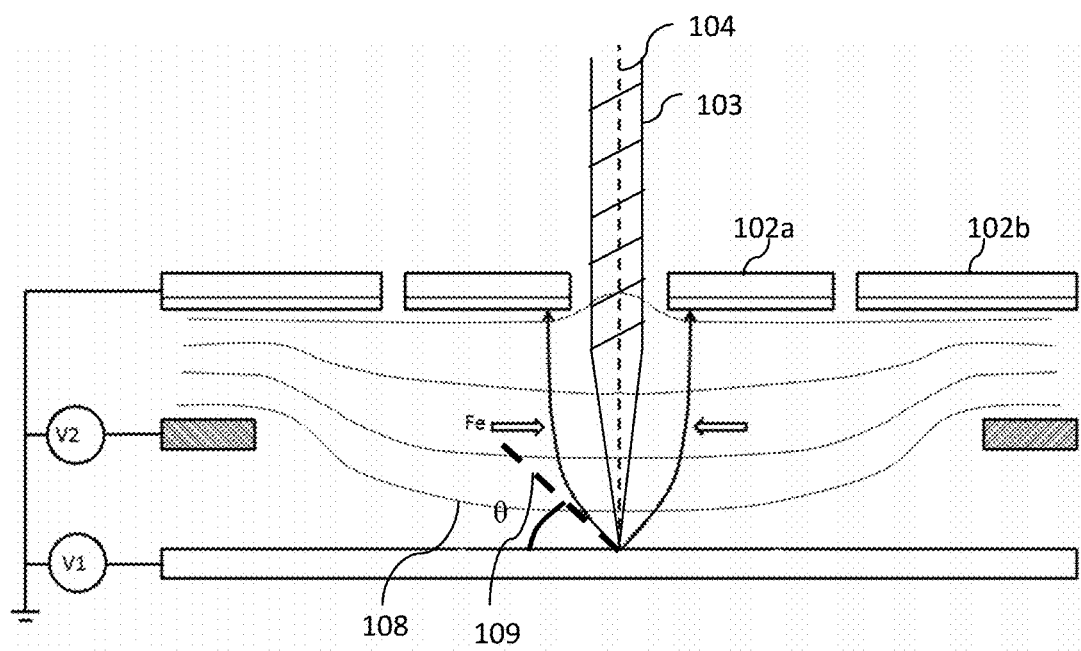
FIG. 2 is a schematic diagram of a movement track of BSEs in a scanning electron microscope according to an embodiment of the disclosure.
Figure 3:
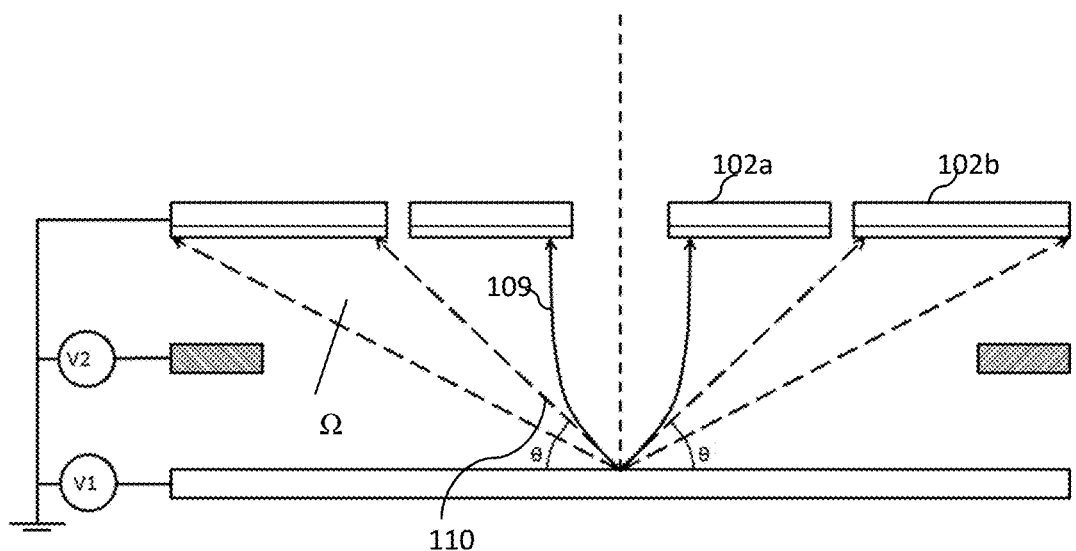
FIG. 3 is a schematic diagram of movement tracks of BSEs and an X-ray in a scanning electron microscope according to an embodiment of the disclosure.

In an embodiment, as shown in FIG. 2 and FIG. 3, a layer of surface metal film is plated on a surface of the annular back-scatter electron detector 102a, and is made of metals with good conductivity such as gold or aluminum, and back-scatter electrons emitted from the specimen pass through the metal film and are detected by a PN junction semiconductor detector. A hermetic window is disposed on a surface of a silicon drift detector of the annular X-ray detector 102b, to protect the silicon drift detector and resist bombardment of back-scatter electrons and the like.

Figure 4:
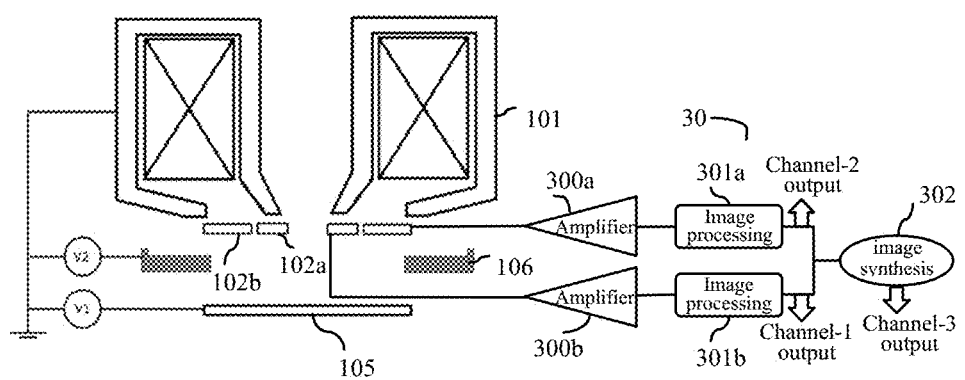
FIG. 4 is a schematic diagram of a detection system of BSEs and an X-ray according to an embodiment of the disclosure.

In an embodiment, as shown in FIG. 4, the detection signal amplification and analysis system 30 is connected to the annular back-scatter electron detector 102a and/or the annular X-ray detector 102b, and is configured to process a first signal generated by the back-scatter electron detector 102a based on received back-scatter electrons and/or configured to process a second signal generated by the X-ray detector 102b based on a received X-ray.

In an embodiment, as shown in FIG. 4, the detection signal amplification and analysis system 30 is connected to the annular BSE and/or the annular X-ray detector, and is configured to process a first signal generated by the annular BSE detector based on received back-scatter electrons and/or configured to process a second signal generated by the X-ray detector based on the received X-ray.

In an actual application process, the detection signal amplification and analysis system 30 may include: a signal amplification subdevice including a first signal amplification subdevice (amplifier) 300a and a second signal amplification device (amplifier) 300b; and a signal processing subdevice including a first signal processing subdevice 301a and a second signal processing subdevice 301b.

The first signal amplification subdevice 300a is configured to amplify a back-scatter electron signal. The second signal amplification device 300b is configured to amplify an X-ray signal.

The signal processing subdevice 301a is configured to process the amplified first signal, and output the processed first signal to form a first image. The second signal processing subdevice 301b is configured to process the amplified second signal and output the processed second signal to form a second image.

The detection signal amplification and analysis system 30 is further configured to synthesize the processed first signal and the processed second signal, to form a composite image. In an implementation process, the detection signal amplification and analysis system 30 may further include a signal synthesis subdevice 302, configured to perform synthesis processing on the first signal processed by the first signal processing subdevice 301a and the second signal processed by the second signal processing subdevice 301b, to form a composite image.

In this embodiment of the disclosure, amplification processing is performed on both a signal output by the back-scatter electron detector and a signal output by the X-ray detector, to generate a back-scatter electron image and an X-ray energy spectrum image for targeted detection. Alternatively, the processed first signal output by the back-scatter electron detector and the processed second signal output by the X-ray detector are synthesized by the signal synthesis subdevice 302, to obtain a composite image at a collection efficiency of 100% or close to 100%.

Figure 5:
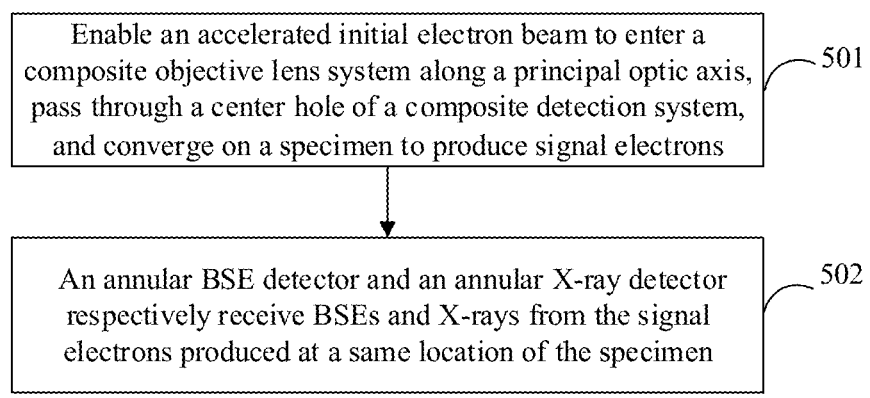
FIG. 5 is a schematic flowchart of a specimen detection method according to an embodiment of the disclosure.

Based on the description of the scanning electron microscope with a composite detection system in the embodiments, an embodiment of the disclosure further provides a specimen detection method. As shown in FIG. 5, the method procedure includes the following steps.

In step 501, an accelerated initial electron beam is enabled to enter a composite objective lens system along a principal optic axis, pass through a center hole of a composite detection system, and converge on a specimen to produce signal electrons.

In step 502, Back-scatter Electrons (BSE) and an X-ray are received by an annular BSE detector and an annular X-ray detector respectively from the signal electrons produced at a same location of the specimen.

In an embodiment, the operation of respectively receiving, by the annular Back-scatter Electron (BSE) detector and the annular X-ray detector, Back-scatter Electrons (BSEs) and an X-ray from the signal electrons produced at a same location of the specimen includes: causing the BSEs in the signal electrons to perform accelerated movement upwards under action of an electric field of an electro lens of the composite objective lens system and under influence of an immersion magnetic lens, and receiving the BSEs by the annular BSE detector in an inner ring; and causing the X-ray produced at the same location of the specimen to move upwards, and to be received by the annular X-ray detector in an outer ring.

In an embodiment, the method further includes the operations of processing, by a detection signal amplification and analysis system, the BSEs received by the annular BSE detector and the X-ray received by the annular X-ray detector, and outputting the processed BSEs and the processed X-ray.

As shown in FIG. 2, when an electro lens 10 works, a voltage V2 of a control electrode 106 and a voltage V1 on the specimen form an electrostatic field between a composite detection system 102 and a specimen 105, and electric potential line distribution of the electrostatic field is shown by 108 in FIG. 2. A surface voltage of the specimen is more negative than a surface voltage of the composite detection system 102, so that an electron beam 103 is decelerated and focused to the specimen, while signal electrons generated by the electron beam on the specimen and emitted upwards, such as back-scatter electrons, are accelerated to the composite detection system.

Herein, because the voltage of the control electrode 106 meets $V2 \geq V1$, the electric potential line 108 forms a downward pocket shape along the control electrode. If BSEs emitted at an angle θ relative to a specimen surface is not affected by external force, the BSEs move on a track along a dotted line direction (shown by 109 in FIG. 2), but due to action of an electric field of the electro lens 10, the BSEs perform accelerated movement upwards through upward attraction of component force of the electric field, and after action of another component force Fe of the electric field towards a principal optic axis 104, the BSEs are received by an annular BSE detector 102a in an inner ring of the composite detection system 102 after the track of the BSEs bends towards the principal optic axis 104. In addition, a magnetic field of an immersion magnetic lens 101 also increases such a track bending effect.

As shown in FIG. 3, an X-ray is a high energy electromagnetic wave with an ultrashort wavelength and is almost not affected by a field of an electromagnetic lens, and therefore BSEs 109 and an X-ray 110 emitted at a same position of the specimen and at a same angle θ are affected by the electromagnetic field differently, so that movement tracks of the BSEs 109 and the X-ray 110 are different, and the BSEs 109 and the X-ray 110 are separated from each other. The BSEs 109 are received by the annular BSE detector 102a in an inner ring, while the X-ray is received by the X-ray detector 102b in an outer ring. A detection external-diameter Φ3 of the X-ray detector determines a solid angle Ω of the X-ray detector. Compared with a conventional side-inserted X-ray detector, this solid angle of the X-ray detector greatly increases a reception amount of the signals, and is helpful to improve the efficiency of the X-ray detector.

In this embodiment of the disclosure, under action of the composite objective lens system 11, the back-scatter electron detector may also receive more BSEs emitted at a small angle relative to the specimen surface, most BSE electrons can be efficiently collected, and merely a small quantity of BSEs pass through a center hole of the detector and are not received. In addition, due to action of an electric field, BSEs bombard the detector in an accelerated manner, which also helps the BSE semiconductor detector to more effectively receive and detect electrons.

In this embodiment of the disclosure, the BSE detector and the X-ray detector that are located below the objective lens of the immersion magnetic lens, the control electrode and the specimen form a retarding electro lens, so as to ensure high resolution of the composite objective lens system and control the path of back-scatter electrons. Back-scatter electrons and an X-ray emitted at a same position of the specimen and at a same emission angle are separated and are received by the annular BSE detector and the X-ray detector respectively. The annular detector can make the system obtain the BSEs and the X-ray emitted at the same position, at the same angle and at the same time, and ensure high collection efficiency, so as to implement fast imaging of a BSE signal image and an X-ray signal image at the same time.

The foregoing provides only description about preferred embodiments of the disclosure and is not intended to limit the protection scope of the disclosure.

The invention claimed is:

1. A scanning electron microscope with a composite detection system, comprising: a composite objective lens system comprising an immersion magnetic lens and an electro lens, and configured to focus an initial electron beam to a specimen to form a convergent beam spot;
a composite detection system located in the composite objective lens system; and a detection signal amplification and analysis system, wherein a magnetic field of the immersion magnetic lens is immersed in the specimen, and an opening direction of a pole piece is directed towards the specimen; the electro lens comprises the composite detection system, the specimen, a control electrode, and a voltage source, and is configured to decelerate the initial electron beam and focus the initial electron beam onto the specimen, and separate Back-scatter Electrons (BSEs) from a transmission path of an X-ray; the composite detection system is located below an inner pole piece of the immersion magnetic lens, is located above the control electrode, and comprises an annular BSE detector and an annular X-ray detector that have a same axis center, where the axis center is a center of a principal optic axis of an electron beam produced by an electron source; the BSE detector is located in an inner ring, and the X-ray detector is located in an outer ring; and the detection signal amplification and analysis system comprises: a first signal amplification subdevice, a second signal amplification subdevice, a first signal processing subdevice and a second signal processing subdevice; wherein the first signal amplification subdevice is connected to the annular BSE detector, the first signal processing subdevice is connected to the first signal amplification subdevice, the second signal amplification subdevice is connected to the annular X-ray detector, and the second signal processing subdevice is connected to the second signal amplification subdevice.

2. The scanning electron microscope of claim 1, wherein the annular BSE detector and the annular X-ray detector are located on a same plane or on different planes.

3. The scanning electron microscope of claim 1, wherein a distance between the control electrode at a lowermost end of the composite objective lens system and the specimen is less than or equal to 5 mm.

4. The scanning electron microscope of claim 1, wherein a distance between the control electrode located at a lowermost end of the composite objective lens system and the specimen is greater than or equal to 0.5 mm and is less than or equal to 2 mm.

5. The scanning electron microscope of claim 1, wherein a diameter of a center hole of the annular BSE detector is less than or equal to 3 mm.

6. The scanning electron microscope of claim 1, wherein a diameter of a center hole of the annular BSE detector is greater than or equal to 0.5 mm and is less than or equal to 2 mm.

7. The scanning electron microscope of claim 1, wherein a diameter of a center hole of the annular X-ray detector is greater than 3 mm and is less than 10 mm.

8. The scanning electron microscope of claim 1, wherein a diameter of a center hole of the control electrode is greater than that of a center hole of the annular BSE detector and is less than or equal to an external diameter of the annular X-ray detector.

9. The scanning electron microscope of claim 1, wherein the annular BSE detector is a semiconductor detector, and
the annular X-ray detector includes a semiconductor silicon drift detector or a semiconductor lithium drift detector.

10. The scanning electron microscope of claim 1, wherein a layer of conductive metal film is disposed on a lower surface of the annular BSE detector; and a hermetic window is disposed on a lower surface of the annular X-ray detector.

11. The scanning electron microscope of claim 1, wherein both a thickness of the annular BSE detector and a thickness of the annular X-ray detector are less than 10 mm.

12. The scanning electron microscope of claim 1, wherein the detection signal amplification and analysis system is connected to at least one of the annular BSE detector or the annular X-ray detector, and is configured to process at least one of the following: a first signal generated by the annular BSE detector based on received back-scatter electrons by the first signal amplification subdevice and first signal processing subdevice, or a second signal generated by the annular X-ray detector based on a received X-ray by the second signal amplification subdevice and the second signal processing subdevice.

13. The scanning electron microscope of claim 12, wherein the detection signal amplification and analysis system further comprises a signal synthesis subdevice, and the signal synthesis subdevice is further configured to synthesize the processed first signal and the processed second signal to form a composite image.

14. A specimen detection method, applied to a scanning electron microscope, with a composite detection system, of claim 1, wherein the method comprises: enabling an accelerated initial electron beam to enter a composite objective lens system along a principal optic axis, pass through a center hole of a composite detection system, and converge on a specimen to produce signal electrons, wherein the composite detection system comprises an annular Back-scatter Electron (BSE) detector and an annular X-ray detector, wherein the BSE detector has a same axis center as that of the annular X-ray detector, where the axis center is a center of the principal optic axis of the electron beam; and respectively receiving, by the annular back-scatter electron BSE detector and the annular X-ray detector, back-scatter electrons BSEs and an X-ray from the signal electrons produced at a same location of the specimen.

15. The specimen detection method of claim 14, wherein the respectively receiving, by the annular Back-scatter Electron (BSE) detector and the annular X-ray detector, Back-scatter Electrons (BSE) and an X-ray from the signal electrons produced at a same location of the specimen comprises:

causing the BSEs in the signal electrons to perform accelerated movement upwards under action of an electric field of an electro lens of the composite objective lens system and under influence of an immersion magnetic lens, and to be received by the annular BSE detector in an inner ring; and causing the X-ray produced at a same location of the specimen to move upwards, and to be received by the annular X-ray detector in an outer ring.

16. The method according to claim 14, wherein the method further comprises:

processing, by a detection signal amplification and analysis system, the BSEs received by the annular BSE detector and the X-ray received by the annular X-ray detector, and outputting the processed BSEs and the processed X-ray.

* * * * *